United States Patent
Staib

(10) Patent No.: US 6,841,777 B2
(45) Date of Patent: Jan. 11, 2005

(54) ELECTRON DIFFRACTION SYSTEM FOR USE IN PRODUCTION ENVIRONMENT AND FOR HIGH PRESSURE DEPOSITION TECHNIQUES

(75) Inventor: Philippe Staib, Lagenbach (DE)

(73) Assignee: Staib Instruments GmbH, Langenbach (DE)

( * ) Notice: Subject to any disclaimer, the term of this patent is extended or adjusted under 35 U.S.C. 154(b) by 0 days.

(21) Appl. No.: 10/664,718

(22) Filed: Sep. 17, 2003

(65) Prior Publication Data

US 2004/0065844 A1 Apr. 8, 2004

(30) Foreign Application Priority Data

Sep. 18, 2002 (EP) ............................................ 02020889

(51) Int. Cl.[7] ............................ H01J 49/04; H01J 37/30
(52) U.S. Cl. ....................... 250/310; 250/306; 250/307; 250/492.1; 250/492.2; 250/492.3
(58) Field of Search .................................. 250/306, 307, 250/310, 396 R, 396 ML, 492.1, 492.2, 492.3

(56) References Cited

U.S. PATENT DOCUMENTS

| | | | | |
|---|---|---|---|---|
| 3,609,432 A | * | 9/1971 | Shimula | 378/141 |
| 3,777,211 A | | 12/1973 | Kuijpers | |
| 4,119,855 A | * | 10/1978 | Bernacki | 378/34 |
| 4,952,814 A | * | 8/1990 | Huntzinger | 250/505.1 |
| 5,200,618 A | * | 4/1993 | Saldin et al. | 250/307 |
| 5,235,239 A | * | 8/1993 | Jacob et al. | 313/363.1 |
| 5,335,258 A | * | 8/1994 | Whitlock | 378/122 |
| 5,347,126 A | * | 9/1994 | Krauss et al. | 250/309 |
| 5,466,933 A | * | 11/1995 | Bryson et al. | 250/305 |
| 6,326,634 B1 | * | 12/2001 | Robinson | 250/505.1 |
| 6,492,644 B1 | * | 12/2002 | Staib | 250/396 R |
| 6,576,908 B1 | * | 6/2003 | Winkler et al. | 250/396 R |
| 6,677,581 B1 | * | 1/2004 | Koinuma et al. | 250/288 |
| 2004/0065844 A1 | * | 4/2004 | Staib | 250/423 R |

FOREIGN PATENT DOCUMENTS

EP 1 113 482 A1 7/2001

OTHER PUBLICATIONS

Rijnders et al., "In situ monitoring during pulsed laser deposition of complex oxides using reflection high energy electron diffraction under high oxygen pressure," *Appl. Phys. Lett.*, vol. 70, No. 14, pps. 1888–1890 (Apr. 7, 1997).

* cited by examiner

Primary Examiner—John R. Lee
Assistant Examiner—Bernard E. Souw
(74) Attorney, Agent, or Firm—Caesar, Rivise, Bernstein, Cohen & Pokotilow, Ltd.

(57) ABSTRACT

An electron source particularly for a RHEED measurement system or a RHEED measurement system as such includes an electron emitter (5), a first deflection stage (6a, b) for radiating an electron beam onto a sample (1), and a second deflection stage between the first stage (6a, b) and the sample 1, preferably near the sample.

16 Claims, 3 Drawing Sheets

ELECTRON DIFFRACTION SYSTEM FOR USE IN PRODUCTION ENVIRONMENT AND FOR HIGH PRESSURE DEPOSITION TECHNIQUES

BACKGROUND OF THE INVENTION

The present invention relates to an electron source, in particular for a RHEED measurement system, as well as a RHEED measurement system as such, and a method of radiating an electron beam with an electron source onto a sample.

The diffraction of electrons on a crystal surface is in many aspects similar to the optical diffraction of light or X-rays. The Bragg's diffraction law applies for both and governs the appearance and size of the diffraction diagram. The two essentials parameters of the incident beam are found in Bragg's diffraction law, i.e. its wavelength and the incidence angle. As the wavelength associated to electrons is small and comparable or smaller to the lattice spacing of atoms in crystals, electron diffraction, as X-ray diffraction, is used to analyze the atomic structure of materials. Because electrons are strongly absorbed, they cannot penetrate or be transmitted through the sample. Unlike for X-ray diffraction, the electron beam diffraction is performed by reflecting the electron beam onto the surface. Two major diffraction techniques have been developed, depending on the incidence angle of the electron beam: at large incidence angle, normal incidence for instance, the suitable wavelength is obtained at lower electron energies in the range 10 eV to 300 eV. This technique is called LEED for Low Energy Electron Diffraction. At grazing incidence angle the energy can be much larger, in the range 10,000 eV to 60,000 eV. This technique is called RHEED for Reflection High Energy Electron Diffraction. Most commonly, the incidence angle is in the range 2 to 4 degrees only. A precise and stable adjustment of the incidence angle is mandatory. Re-adjustments of the incidence angle are frequently needed when changing the beam energy or the orientation of the sample.

The RHEED technique has recently grown to be a major investigation tool for monitoring crystal growth in vacuum chambers. It is commonly used to control in-situ during the growth process the quality and thickness of the material deposited under good vacuum conditions with pressure in the range $10^{-6}$ to $10^{-11}$ Torr.

A conventional set-up for RHEED is given in FIG. 7: a high energy electron emitter 5' produces a dense, well collimated beam 7'. The beam impinges the surface of a sample 1' at low incidence angle. The beam 7' is diffracted according to the crystal structure of the surface and the diffraction diagram is observed on a fluorescent screen 20' mounted inside the vacuum chamber on the other side of the sample.

The high energy electron emitter 5' is mounted by means of flanges 3' and 4' onto the vacuum chamber 2'. The axis of flange 3' can have various orientations depending on the chamber design: it usually points towards the centre of sample 1', but the axis is also often parallel to the surface, as shown in FIG. 7. A deflection stage (electrostatic or magnetic) 6'a, b is used to adjust the beam onto the sample 1'. The deflection should be in two perpendicular directions X and Y. The deflection stage consists of separate units 6'a and 6' b for X and Y orientation. The deflection stage can be located inside (electrostatic or magnetic) or outside the electron source (magnetic). Optionally, a mechanical device consisting of a vacuum bellow 8' and adjustment screws 9' may be added to adjust the orientation and position of the electron source with respect to the sample.

This conventional design, with or without mechanical stage, is the most commonly used RHEED set up. It is however strongly limited for the following new applications in particular in wafer production devices and in high pressure environment:

Wafer production machines for MBE, CVD, etc. have a large vacuum chamber. The distances travelled by the electron beam are in the meter range instead of the decimetre range. The beam position and stability is much more affected by residual magnetic fields, such as the earth magnetic field and by AC magnetic field generated by the equipment around the beam (mostly at the frequency of the main power line) and the stray magnetic fields generated by other components of the system (such as magnetron evaporation sources). The effect of the mere earth magnetic field (about 0.6 gauss) becomes important: a 35 kV electron beam travelling 500 mm inside a vacuum chamber follows a circular path. The beam is deflected from its original axis and its orientation angle is changed. The deflection angle is as large as 2.7 degrees and beam off set distance is 12 mm at the sample position. Similarly, an AC field of 80 mGauss will broaden the beam (defocusing) increasing the beam spot size up to 3 mm.

Many growth equipments work at higher gas pressure in the chamber, and often use reactive and/or toxic substances. The electron source uses a filament heated to temperatures in the range 800° C. to 1800° C. to thermally emit electrons. The vacuum inside the electron source has to be kept as good as possible in order not to damage the filament (by evaporation and burning). The filament will be also damaged from ions produced in the gas inside the source.

The production machines run over months without stopping or venting the chamber. Huge amounts of material is evaporated and deposited. Some of this material reached the electron emitter and is deposited onto parts of the electron source. The described system will also be used in such harsh environments, especially when hazardous elements are involved, to protect the electron optical system. Besides increasing the reliability of RHEED source, it greatly reduces the amount of contamination on the cathode parts needed to be exchange regularly.

Accordingly, the main problems of the conventional systems result from: 1—a large distance between sample 1 and flange 3, 2—a higher pressure into the chamber and 3—the presence of stray magnetic fields created by some devices in the chamber.

In view of the above problems, an improved design has been proposed for operation at higher pressure (see J. H. Guus et al. in "Appl. Phys. Lett.", vol. 70, 1997, p. 1888–1890). As shown in FIG. 8, a differential pumping capability is added to the electron radiation system. A small aperture 10' (0.1 mm to 2 mm) is inserted between the emitter 5' and the vacuum chamber 2'. A pumping port 11' is added to differentially pump the emitter volume. Further, an additional differential aperture 13' is added. This aperture is located close to the sample to limit the distance travelled by the electron beam 7' in poor vacuum. This reduces beam absorption and diffusion from the gas in the vacuum chamber. The space in between the apertures 13' and 10' is pumped out through the flange 12'. The electron beam from the emitter 5' is precisely focussed and aligned using the deflection stage 6'a, b on the small aperture 13'. The beam emerges into the vacuum chamber 2' on the axis of the system.

This is the major limitation of the design. In order to adjust the incidence angle, the complete set-up, electron source, vacuum pipes and vacuum hoses have to be mechanically moved. This is achieved using mechanical positioning devices 9'a, b allowing the translation in X and Y directions (9'b) and a tilt of the axis (9'a). The amplitude of displacements is limited by the size of the inner tube of flange 3'. Then, the sample has to be moved also in order to optimise the incidence angle. However, many vacuum systems have a mechanically fixed the sample position and the beam alignment is not possible using this design. Further the mechanical adjustment of the incidence angle is not an easy operation. Owing to the weigh of the electron source (10 to 25 kg), an the vacuum pipe connections to the pumps used for differential pumping, a very sturdy vacuum bellow system 8' must be used to precisely keep the assembly in position.

OBJECTS OF THE INVENTION

An object of the invention is to provide an improved electron source avoiding disadvantages of the conventional systems. In particular, a system is to be provided offering improved beam adjustment capability for RHEED diffraction. Furthermore, the precision and stability of the beam adjustment are to be improved. Another object of the invention is to provide an improved method of radiating an electron beam onto a sample.

SUMMARY OF THE INVENTION

According to a first aspect of the invention, an electron source, in particular for a RHEED measurement system, is provided with an electron emitter for generating an electron beam and a first deflection stage for radiating the electron beam onto a sample, wherein a second deflection stage for an electronic beam orientation correction is provided between the first deflection stage and the sample, preferably near the sample. The provision of the second deflection stage offers the following advantages. The system offers full electronic beam adjustment capability for RHEED diffraction without mechanical re-adjustments of the vacuum parts (neither the electron source parts nor the sample holder have to be moved). This new design allows the electron source and all attached pumping utilities to be mounted in a fixed mechanical position. The beam position on the sample, as well as the incidence angle can be controlled entirely electronically. The precision and stability of the beam is far better than using the mechanical stages.

According to a preferred embodiment of the invention, the electron source comprises an elongated vacuum tight tube-shaped casing separating the path of the electron beam travelling from the electron emitter via the first deflection stage to the second deflection stage against a surrounding, e.g., a vacuum chamber. The casing has the advantage of protecting in particular the electron emitter against deteriorating influences from the surrounding, e.g. from reaction gases. Preferably, the casing is made of a material shielding magnetic fields. Accordingly, influences from magnetic stray fields can be avoided.

For a further protection of the electron emitter, the inner space of the casing is connected with at least one pumping device for evacuating the inner space of the casing. Preferably, both the electron emitter and the inner space of the casing are connected with two pumping devices forming a differential vacuum pump device.

The effect of the at least one pumping device can be further improved if an aperture is provided at or near the second deflection stage. The aperture represents a barrier for gases that could travel from the vacuum chamber into the electron source. According to preferred embodiments, the aperture has a point shape or a slit shape. The advantage of the point shape is the provision of a very small area forming an effective gas barrier. The advantage of the slit shape relates to an extended adjustment capability of the electron source.

For particular applications, it may be advantageously to cover the aperture with a thin foil being capable to transmit the electron beam. The thin foil represents a tight barrier for any molecules inside the vacuum chamber or from other surrounding. The space from the electron emitter via the first and second deflection stages to the covered aperture is vacuum tightly separated from the surrounding.

This embodiment has an essential advantage. It allows for the first time to provide an electron beam with a defined orientation, in particular for RHEED measurements, at an elevated pressure up to normal atmospheric pressure. The inventor has found that the range of the electron beam at normal pressure in air or other light atomic number gas (e. g. pure N, He etc.) is large enough to build a diffraction device. The sample has to be located close enough to the exit window (aperture with foil), e.g. in the range of 5 mm to 25 mm.

Another subject of the invention is a RHEED measurement system, provided with the inventive electron source. The RHEED measurement system can be adapted for conventional operation under vacuum conditions or alternatively for operation under atmospheric pressure.

According a further aspect of the invention, a method of radiating an electron beam onto a sample is provided, wherein after generating the electron beam with an electron emitter and directing the electron beam with a first deflection stage towards the sample, a further step of correcting the beam orientation of the electron beam with a second deflection stage being arranged between the first deflection stage and the sample.

According to a preferred embodiment of the invention, the electron beam is deflected from the optical axis with the first deflection stage, wherein the beam travelling between the two deflection stages becomes elongated from the axis and the second deflection stage is bending the beam back towards the axis of the electron source.

BRIEF DESCRIPTION OF THE DRAWINGS

Further details and advantages of the invention will be described in the following with reference to the attached drawings. The drawings show in.

PREFERRED EMBODIMENTS OF THE INVENTION

Figure 1:
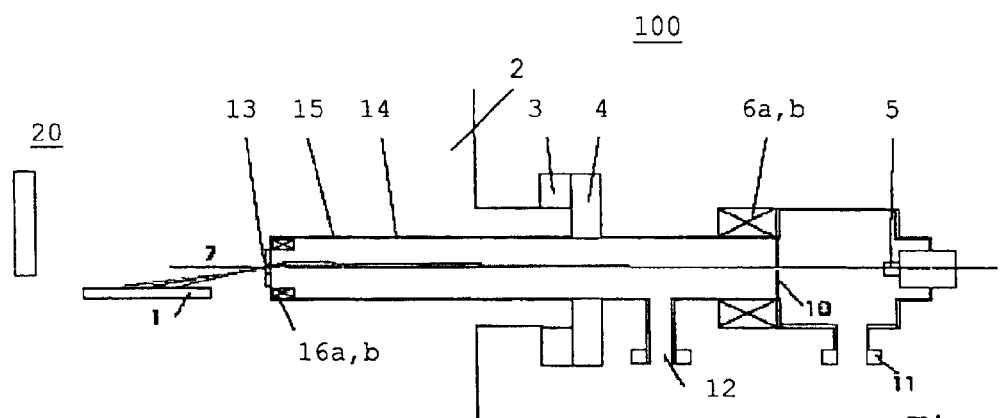
FIGS. 1 to 3: schematic illustrations of a first embodiment of an electron source according to the invention.
Figure 8:
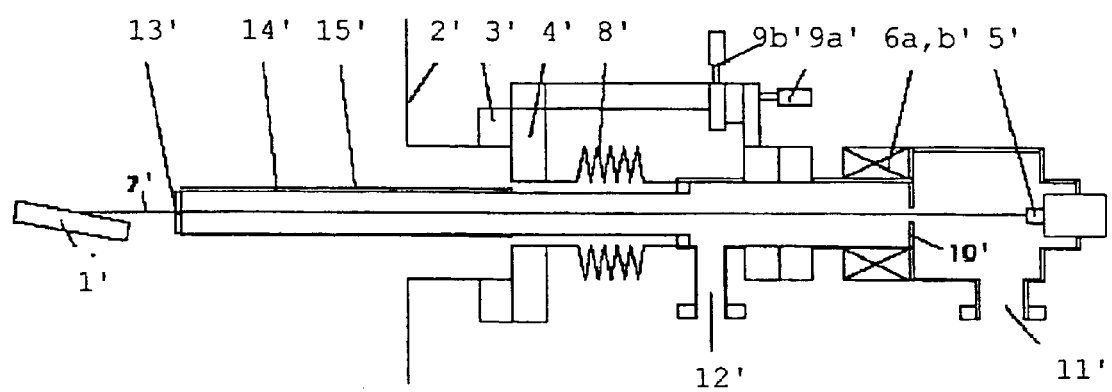

A first embodiment of an electron source 100 is shown in FIG. 1. The electron source 100 has a basic structure like a conventional system as shown in FIG. 8. Corresponding parts are indicated with corresponding reference numerals. The electron emitter 5 (electron gun) with a first deflection stage 6a,b is mounted via flanges 3, 4 to a vacuum chamber 2 (shown in part). The line from the electron emitter 5 to the first deflection stage 6a,b defines an axis of the electron source. The vacuum chamber 2 is a recipient of a deposition apparatus or a measuring device, for example. The electron source 5 is adapted for irradiating a sample 1 (e.g. a wafer) within the vacuum chamber e.g. for a RHEED measurement. A pumping port 11 is provided for differentially pumping the emitter volume.

According to the invention, a second deflection stage 16a,b is added to the system. The second deflection stage 16a,b is arranged between the first deflection stage 6a,b and the sample 1, i.e. on the side of the first deflection stage 6a,b opposite to the electron emitter 5. Preferably, the second deflection stage 16a,b is positioned as near to the sample 1 as possible in view of the particular mechanical constrains in the vacuum chamber (in particular size of the sample 1 and sample holder, avoiding shadows). The distance from the second deflection stage to the first deflection stage is higher than the distance from the second deflection stage to the sample (preferably smaller than 10 cm). The second deflection stage 16a,b is arranged on the axis of the electron source 5. The construction and control of deflections stages is known as such, so that further details of these components are not described here.

The beam or radiation path of the electron beam 7 between the electron emitter 5 and the deflection stages is shielded with a casing. The casing is a vacuum tight tube (or pipe) 14, which isolates the electron source parts from the vacuum chamber 2. Between the emitter 5 and the casing, a small aperture 10 (0.5 to 2 mm) is inserted. For reducing the effects of magnetic fields, tube 14 can be made of magnetic shielding material, or a magnetic shielding tube (or pipe) 15 can be added. In this embodiment, the casing serves for mechanically connecting the electron source 5 to the vacuum chamber 2.

A second pumping port 12 is provided for differentially pumping the inner space of the casing. The pumping ports 11, 12 are connected with at least one pumping device, e.g. a vacuum pump.

At the distal end of the casing, an exit aperture 13 is provided at or near the second deflection stage. The exit aperture 13 can have a small area for differential pumping or a larger if differential pumping is not required.

The arrangement of FIG. 1 comprising the electron source 5, a sample holder for carrying the sample 1 and the detector 20 represents a RHEED measurement system of the invention. Further parts like e.g. a control circuit are not shown.

Figure 2:
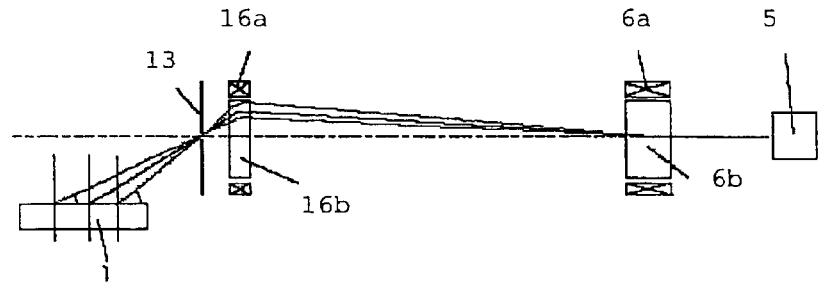

The beam path is shown in FIG. 2, where the angles are exaggerated for more clarity. Instead of following an axial path through the system, the beam is deflected twice before exiting the aperture 13. The electron beam is first deflected from the optical axis using the deflection stage 6a,b. The beam travelling between the two deflection stages becomes elongated from the axis. The deflection stage 16a,b located near the aperture 13 bends the beam back towards the axis. The deflection strengths of 16a,b and 6a,b are adjusted such that the beam exits through the aperture 13. The beam will now be tilted with respect to the axis of the tube. The tilt can occur in any directions, depending on the adjustments of the deflections in X and Y directions.

Typical experimental values are as follows:

| | |
|---|---|
| Distance aperture 13 to sample 1 | 20 to 60 mm |
| Aperture diameter | 50 μm to 1 mm (when differential pumping is used) |
| Maximum tilt angle of the beam | 5 to 20 degrees |

This design allows the adjustment of the incidence angle by electrical control only.

Figure 3:
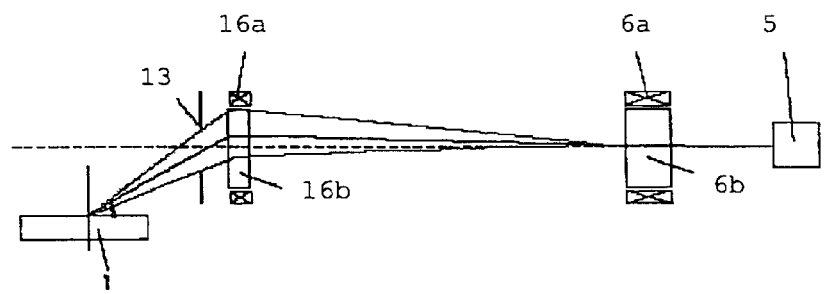

FIG. 3 illustrates an embodiment of the invention with a slit shaped aperture. The impact point of the electron beam onto the sample will move by changing the incidence angle. This may not be a severe limitation unless the sample has a small size or the user do wants to analyze a specific spot on the sample. The use of a slit shaped instead of a small size aperture offers the capability of both changing the incidence angle and keeping the beam on a fixed spot. FIG. 3 shows schematically the design of the aperture. The long side of the slit 13 is oriented perpendicular to the sample surface. Assuming a distance slit to sample of 50 mm, a slit of 5 mm length allows a range of variation of about 6°.

As the slit has an area, which is larger than that of a small aperture, the efficiency of the differential pumping could be lowered. A preferred value is a slit size of 5 mm by 0.1 mm. This area can still be used for pressures up to 100 mTorr in the chamber.

The aperture 13 can be covered with a thin foil being capable to transmit the electron beam. The foil provides a vacuum tight seal of the source volume from the vacuum chamber. A material with a light atomic number should be used to limit absorption and scattering of the high energy electron beam. Aluminium, magnesium, silicon or carbon foil with a thickness below 1 μm is preferred. The beam transmission at 40 keV is well above 95%.

The source and attached pipes can be kept under good vacuum using a small pump, much smaller than the one used for the differential pumping system. Even if the foil has micro-holes or similar damages, the pumping will be orders of magnitude easier. The shielding of the inner source parts will be improved in the same manner.

Figure 4:
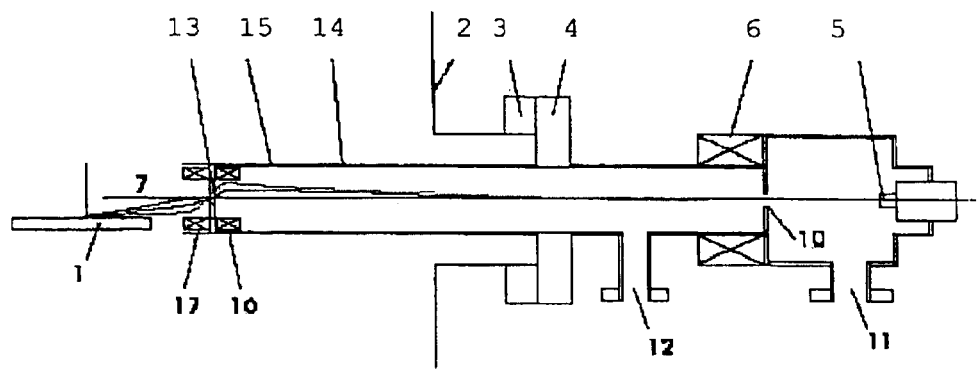
FIGS. 4 to 6: schematic illustrations of further embodiments of an electron source according to the invention.
Figure 5:
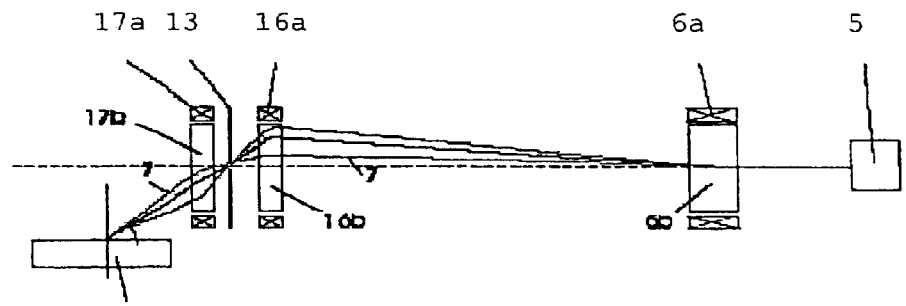

FIGS. 4 and 5 illustrate an embodiment of the invention with an additional beam deflection in the vacuum chamber. This embodiment allows the variation of the incidence angle while keeping the same spot on the sample and using a smaller aperture. It can also compensate for magnetic fields inside the vacuum chamber.

A third deflection stage 17a,b is mounted in front of the aperture on side of the vacuum chamber 2. The beam deflected as previously is re-oriented towards the sample using the third deflection stage 17a,b. Deflections are adjusted such that the beam impinges a fixed spot on the sample. This design provides the best flexibility and is preferred for highest chamber pressures and/or for large vacuum chamber 2 where the exact position of the sample with respect to the axis of the mounting flange may not be precisely known.

The additional deflection stage 17a,b can also be used to compensate for magnetic fields between exit aperture 13 and the sample 1: any residual magnetic field exiting in the space between the exit aperture 13 and the sample 1 will curve the electron paths. Deflection 17 is used to compensate for this drift.

Figure 6:
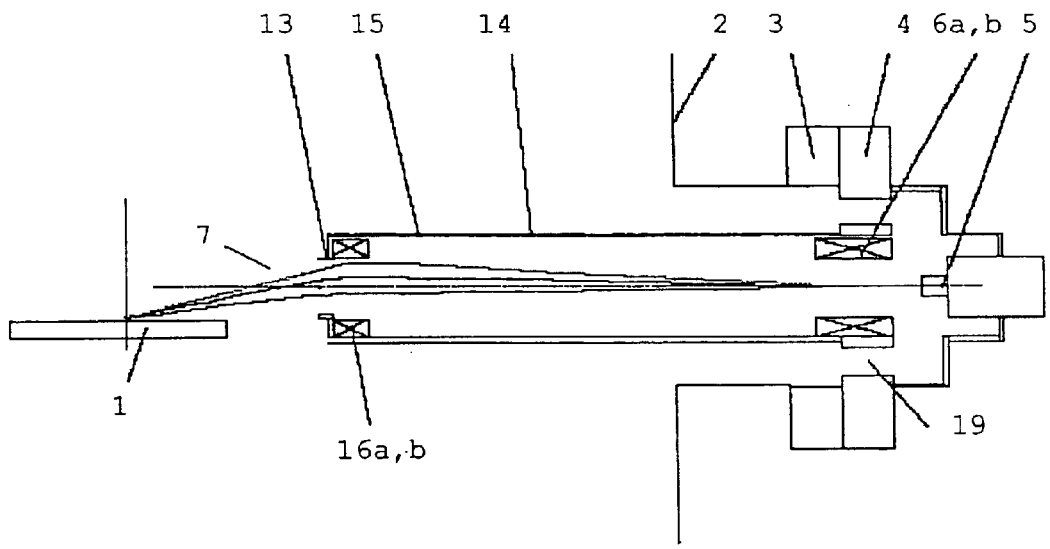
Figure 7:
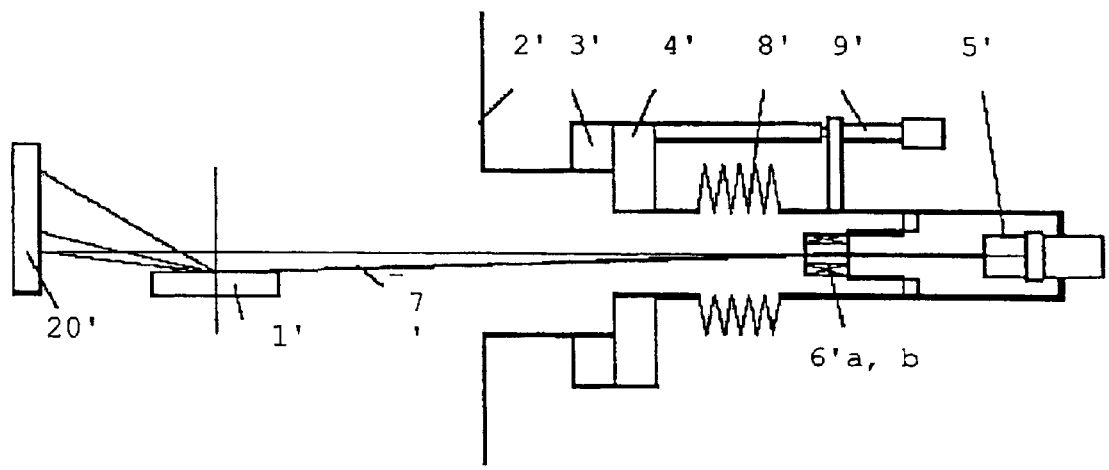
FIGS. 7 to 8: schematic illustrations of conventional electron sources (prior art).

According to a modified embodiment, the invention can be used in both high pressure environment and/or high material flux conditions (dual applications of the system). Used under good vacuum condition in the chamber (below $10^{-6}$ Torr), it protects very efficiently the electron source from contaminations due to high material fluxes used to growth inside the vacuum chamber. A typical set up is shown in FIG. 6. The apertures are enlarged or even removed and the source does not require a differential pumping. The casing 14, 15 (tube construction) will provide a very effective protection against the flux of materials towards the electron source.

Additional pumping holes 19 can be used to better pump the electron source from the chamber while keeping the contamination flux very low.

The invention can be implemented with the following further modifications.

For best operation, the deflection should be actuated in two perpendicular directions X and Y using separate deflection stages labelled as 6a and 6b, 16a and 16b, 17a and 17b. However, as the orientation perpendicular to the sample surface is the most meaningful, a unidirectional design could used, provided that the deflection stages are oriented correctly with respect to the surface.

Deflection stages 6a,b 16a,b 17a,b can be located inside or outside the vacuum casing (pipe).

A magnetic shielding is recommended, but not mandatory. The shield can be a tube made of magnetic shielding material added inside or outside the vacuum pipe 14. Alternatively, the vacuum pipe itself can be made of magnetic shielding material. The deflection stage 16a,b must be located inside the magnetic shielding. The external deflection stage 17a,b can be positioned either way inside of outside the shielding.

The apertures 13 and 10 may not have a circular shape, but any shape and thickness as far as a useful electron beam is transmitted.

With an electron source according to the invention, the following particular results have been obtained. The double differential pumping system has been tested and works up to pressures of 1 Torr in the chamber. This value is the highest pressure ever reached. The system is very precise, stable and surprisingly easy to adjust.

The embodiment of FIG. 6 was tested in a production device. The stability of the beam position on the sample is better than 30 micrometer for distance of 600 mm diameter between flange 3 and sample 1, far better than using a mechanical adjustment.

What is claimed is:

1. An electron source, comprising:
   an electron emitter for generating a high-energy collimated electron beam for diffraction applications;
   a first deflection stage for radiating the electron beam onto a sample; and
   a second deflection stage being arranged between the first deflection stage and the sample such that a distance from the second deflection state to the first deflection stage is greater than a distance from the second deflection stage to the sample, said second deflection stage being adapted for a beam orientation correction;
   a casing extending from the first deflection stage to the second deflection stage; and
   an exit aperture arranged between the second deflection stage and the sample, said exit aperture representing a barrier for gases which could travel from the sample into the casing.

2. The electron source according to claim 1, wherein the casing is made of or covered with a magnetic field shielding material.

3. The electron source according to claim 1, wherein an inner space of the casing is connected with a pumping device being adapted for evacuating the inner space of the casing.

4. The electron source according to claim 1, wherein the exit aperture has a point shape or a slit shape.

5. The electron source according to claim 1, wherein a third deflection stage is provided between the second deflection stage and the sample.

6. The electron source according to claim 5, wherein the exit aperture is provided between the second and third deflection stages.

7. The electron source according to claim 1, wherein the exit aperture is covered with a foil capable of transmitting the electron beam.

8. A Reflection High Energy Electron Diffraction (RHEED) measurement system, comprising:
   an electron source according to claim 1,
   a sample holder for supporting said sample to be investigated, and
   a detector device for detecting diffracted electrons.

9. The RHEED measurement system according to claim 8, wherein the sample holder is positioned in a vacuum chamber.

10. The RHEED measurement system according to claim 8, wherein the sample holder is positioned under atmospheric pressure.

11. A method of radiating an electron beam with an electron source according to claim 1 onto a sample, comprising the steps of:
    generating the electron beam with the electron emitter;
    directing the electron beam with the first deflection stage towards the sample; and
    correcting the beam orientation of the electron beam with the second deflection stage.

12. The method according to claim 11, wherein the electron beam is deflected from an optical axis with the first deflection stage, wherein the beam travelling between the two deflection stages becomes elongated from the axis and the second deflection stage is bending the beam back towards die axis of the electron source.

13. The method according to claim 11 or 12, wherein a radiation path of the electron beam between the first and second deflection stages is shielded with a casing.

14. The method according to claim 13, wherein the path of the electron beam within the casing is shielded against magnetic fields.

15. The method according to claim 14, wherein an inner space of the casing is evacuated with a pumping device.

16. The method according to claim 15, wherein the irradiated sample is located under atmospheric pressure.

* * * * *

UNITED STATES PATENT AND TRADEMARK OFFICE
CERTIFICATE OF CORRECTION

PATENT NO.    : 6,841,777 B2
DATED         : January 11, 2005
INVENTOR(S)   : Phillppe Staib It is certified that error appears in the above-identified patent and that said Letters Patent is hereby corrected as shown below:

Title page,
Item [73], Assignee, delete "Instruments" and insert -- Instrumente --.

Signed and Sealed this

Twenty-first Day of February, 2006

JON W. DUDAS
*Director of the United States Patent and Trademark Office*